United States Patent
Jang et al.

(10) Patent No.: US 6,762,620 B2
(45) Date of Patent: Jul. 13, 2004

(54) CIRCUIT AND METHOD FOR CONTROLLING ON-DIE SIGNAL TERMINATION

(75) Inventors: Seong-Jin Jang, Sungnam (KR); Jin-Seok Kwak, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/235,694

(22) Filed: Sep. 5, 2002

(65) Prior Publication Data

US 2003/0218477 A1 Nov. 27, 2003

(30) Foreign Application Priority Data

May 24, 2002 (KR) ........................................ 2002-28845

(51) Int. Cl.[7] .............................................. H03K 17/16
(52) U.S. Cl. .............................. 326/30; 326/27; 326/83; 326/87
(58) Field of Search .............................. 326/26, 27, 30, 326/82, 83, 86, 87

(56) References Cited

U.S. PATENT DOCUMENTS

| | | | | |
|---|---|---|---|---|
| 4,621,226 A | * | 11/1986 | Powell | 324/649 |
| 5,923,595 A | | 7/1999 | Kim | 365/189.05 |
| 6,127,862 A | * | 10/2000 | Kawasumi | 327/112 |
| 6,154,047 A | | 11/2000 | Taguchi | 326/30 |
| 6,232,792 B1 | | 5/2001 | Starr | 326/30 |
| 6,281,709 B1 | * | 8/2001 | Seyyedy | 326/87 |
| 6,288,563 B1 | * | 9/2001 | Muljono et al. | 326/27 |
| 6,420,899 B1 | * | 7/2002 | Crittenden et al. | 326/30 |

* cited by examiner

*Primary Examiner*—Don Le
(74) *Attorney, Agent, or Firm*—Mills & Onello, LLP

(57) ABSTRACT

A system and method allows for multiple modes of termination, including termination by a fixed value that is preprogrammed, and by a variable value that can, for example, be measured and determined by a self-calibration circuit. Multiple termination values can be achieved within a single device. This configuration is especially applicable to devices that have different loadings for address and data signals, for example in a configuration having a common, shared address bus, and multiple, localized data buses.

54 Claims, 11 Drawing Sheets

FIG. 11

| INPUTS | ICONP1 | ICONP2 | ICONP3 | ICONP4 | ICONP5 | TERMINATION VALUE | KEY ADDRESS (MRS) | |
|---|---|---|---|---|---|---|---|---|
| INPUT VALUE | 0 | 1 | 1 | 1 | 1 | | | |
| OUTPUTS | ICONPA1 | ICONPA2 | ICONPA3 | ICONPA4 | ICONPA5 | | | |
| MRS_ADDR1 | 0 | 1 | 1 | 1 | 1 | THE SAME | A3=1 | A2=1 |
| MRS_ADDR2 | 1 | 0 | 1 | 1 | 1 | TWICE | A3=1 | A2=0 |
| MRS_ADDR3 | 1 | 1 | 0 | 1 | 1 | 4 TIMES | A3=0 | A2=1 |
| MRS_ADDR4 | 1 | 1 | 1 | 1 | 1 | DEACTIVATION MODE | A3=0 | A2=0 |

| INPUTS | ICONN1 | ICONN2 | ICONN3 | ICONN4 | ICONN5 | TERMINATION VALUE | KEY ADDRESS (MRS) | |
|---|---|---|---|---|---|---|---|---|
| INPUT VALUE | 1 | 0 | 0 | 0 | 0 | | | |
| OUTPUTS | ICONNA1 | ICONNA2 | ICONNA3 | ICONNA4 | ICONNA5 | | | |
| MRS_ADDR1 | 1 | 0 | 0 | 0 | 0 | THE SAME | A1=1 | A0=1 |
| MRS_ADDR2 | 0 | 1 | 0 | 0 | 0 | TWICE | A1=1 | A0=0 |
| MRS_ADDR3 | 0 | 0 | 1 | 0 | 0 | 4 TIMES | A1=0 | A0=1 |
| MRS_ADDR4 | 0 | 0 | 0 | 0 | 0 | DEACTIVATION MODE | A1=0 | A0=0 |

CIRCUIT AND METHOD FOR CONTROLLING ON-DIE SIGNAL TERMINATION

RELATED APPLICATION

This application claims the benefit of the priority date of Korean Application No. 2002-28845, filed May 24, 2002.

FIELD OF THE INVENTION

The present invention relates to an integrated circuit in a semiconductor memory device for controlling impedance matching in the semiconductor memory device, and particularly to a semiconductor memory device for controlling on-die (on-chip) termination and further to a control circuit thereof.

BACKGROUND OF THE INVENTION

CPUs, semiconductor memory devices, and gate arrays find application in electronic devices such as personal computers, servers, and workstations. In most cases, the devices include input pads and related circuits for inputting signals from an external source, and output pads and related circuits for outputting signals to an external source.

As the integration and speed of electronic devices increases, the swing width, or peak-to-peak voltage, of interface signals between the devices necessarily decreases. Reduction of swing width minimizes the time delay involved in signal transfer. However, as the swing width of signals is decreased, the influence of external noise on the signals also increases, and signal reflection from the receiving terminal becomes increasingly critical due to impedance mismatch. The impedance mismatch may be generated due to external noise, variation of the power supply, variation of the operating temperature, and variation in manufacturing process. If an impedance mismatch occurs, it is difficult to obtain high transfer speed in data transfer systems, and output data from output terminals of semiconductor memory devices may vary or may be unreliable, causing data transfer failure. In view of this, receiving terminals of devices are designed to include signal termination circuitry, referred to herein as on-chip termination or on-die termination, that mitigate impedance mismatch. Such impedance matching circuits and related circuits are located proximal to the input/output pads of the devices. At the transmitting end of a data transfer system, source termination is commonly employed, while at the receiving end, parallel termination is commonly employed.

Semiconductor memory devices such as DDR SDRAMs (Double Data Rate Synchronous Dynamic Random Access Memories) adopt termination circuits implemented with resistor units having a fixed value as illustrated in FIG. 1. FIG. 1 demonstrates a conventional arrangement for a termination circuit for terminating bonding pads in an integrated circuit (IC). Referring to FIG. 1, a plurality of input pads PD1, PD2, PD3, . . . are connected to a plurality of data nodes RD1, RD2, RD3 . . . via a plurality of termination circuits 10, 20, 30, . . . respectively.

FIG. 2 is a schematic illustration of a typical example of the termination circuit block BA1 of FIG. 1. The termination circuit 10 is comprised of resistors R1, R2 connected to the input pad PD1 of the receiver. Resistor R1 is connected to a power supply VDD, while resistor R2 is connected to a ground VSS, An input circuit, such as an input buffer, may be connected to node RD1 in parallel with the termination circuit 10. In one example, if the termination circuit 10 is designed to have an parallel sum impedance value of 60 ohms, then the value of each resistor R1, R2 is 120 ohms.

The conventional on-chip termination circuit has a fixed value of resistor as shown in FIG. 2, and the impedance value therefore cannot be adjusted to compensate for variations in the external environment. Thus, a variable termination operation is not achieved by this configuration.

SUMMARY OF THE INVENTION

The present invention is directed to a system and method that allows for multiple modes of termination, including a fixed value that is preprogrammed, and a variable value that can, for example, be measured and determined by a self-calibration circuit. The present invention also provides for the possibility of multiple termination values within a single device. This is especially applicable to devices that have different loadings for address and data signals, for example in a configuration having a common, shared address bus, and multiple, localized data buses.

In one aspect, the present invention is directed to a control circuit for controlling the impedance of a pad termination comprising: a first input for inputting a variable impedance value; a second input for inputting a fixed impedance value; and a selector for selecting one of the fixed impedance value and the variable impedance value in response to a selection signal. The selector further outputs a selected impedance value to a pad termination circuit that provides the impedance of the pad termination in response to the selected impedance value.

The fixed impedance value may be generated in response to an open or closed state of a fuse, hard-wired state, or bonding state. The fixed impedance value may comprise a first fixed impedance value and third input may be provided for inputting a second fixed impedance value. In this case the selector selects one of the first fixed impedance value, the second fixed impedance value and the variable impedance value in response to the selection signal, and outputs the selected impedance value to the pad termination circuit.

A fourth input may be provided for inputting a deactivation impedance value, in which case the selector selects one of the fixed impedance value, the variable impedance value, and the deactivation impedance value in response to the selection signal, and outputs the selected impedance value to the pad termination circuit.

The pad termination circuit may apply the deactivation impedance value by removing the applied impedance. The selector may comprise a multiplexer. The variable impedance value may be generated by a self-calibration circuit.

The self-calibration circuit preferably comprises: a reference node that is coupled to a bonding pad having a reference impedance; a first comparator having a first input coupled to the reference node and a second input coupled to a reference voltage, the comparator comparing the first input and the second input to generate a comparison output; and a plurality of impedance loads in parallel between the reference node and a first reference voltage; the plurality of impedance loads being selectively activated in response to the comparison output to provide a combined impedance that substantially matches the reference impedance.

The first and second impedance values preferably comprise a plurality of binary bits. The pad termination circuit comprises a bank of resistors, individually selectable according to the binary bits of the first or second impedance values. The plurality of resistors have resistance values that are binary multiples of each other and are connected to a common node that is coupled to a bonding pad, and the impedance of the pad termination is determined by the combined selected resistance values.

The selected impedance value comprises a first selected impedance value and a second selector may be included for receiving the first selected impedance value, and for outputting a second selected impedance value to a second pad termination circuit that provides a second impedance of a second pad termination in response to the second selected impedance value. The second selected impedance value may be one of the same as the first selected impedance value, a multiple of the first selected impedance value, a deactivation value, or may be independent of the first selected impedance value. One of the first impedance value and second impedance value may be used for termination of one of data and address pads and the other of the first impedance value and second impedance value may be used for termination of the other of data and address pads.

At least one of the first and second selected impedance values may be further used for termination of command signal pads. The command signal pads may comprise pads for at least one of a chip select signal (CSB), a row address signal (RASB), a column address strobe signal (CASB) and a write enable signal (WEB).

The selection signal is preferably generated in response to a mode register set (MRS) command used for setting the operation mode of a memory device.

The impedance value may comprise pull-up and pull-down impedance values.

In another aspect, the present invention is directed to a control circuit for controlling the impedance of a pad termination at first and second circuit pads comprising a first circuit and a second circuit. The first circuit generates a first selected impedance value and comprises a first input for inputting a variable impedance value; second input for inputting a fixed impedance value; and a selector for selecting one of the first fixed impedance value and the variable impedance value in response to a selection signal, and for outputting a first selected impedance value to a first pad termination circuit that provides the impedance of the first circuit pad termination in response to the first selected impedance value. The second circuit generates a second selected impedance value and comprises: a third input for inputting the first selected impedance value; and a selector, in response to the first selected impedance value, for outputting a second selected impedance value to a second pad termination circuit that provides the impedance of the second pad termination in response to the second selected impedance value.

The second selected impedance value may be one of the same as the first selected impedance value, a multiple of the first selected impedance value, a deactivation value, or is independent of the first selected impedance value. The one of the first impedance value and second impedance value may be used for termination of one of data and address pads and the other of the first impedance value and second impedance value may be used for termination of the other of data and address pads.

The fixed impedance value may comprise a first fixed impedance value and the first circuit may further comprise a fourth input for inputting a second fixed impedance value, and wherein the selector selects one of the first fixed impedance value, the second fixed impedance value and the variable impedance value in response to the selection signal, and outputs the selected impedance value to the first pad termination circuit.

The first circuit may further comprises a fifth input for inputting a deactivation impedance value, in which case the selector may select one of the fixed impedance value, the variable impedance value, and the deactivation impedance value in response to the selection signal, and outputs the selected impedance value to the first pad termination circuit.

In another aspect, the present invention is directed to a method for controlling the impedance of a pad termination comprising: inputting a variable impedance value at a first input; inputting a fixed impedance value at a second input; and selecting one of the fixed impedance value and the variable impedance value in response to a selection signal, and outputting a selected impedance value to a pad termination circuit that provides the impedance of the pad termination in response to the selected impedance value.

In another aspect, the present invention is directed to a method for controlling the impedance of a pad termination at first and second circuit pads comprising: generating a first selected impedance value comprising: inputting a variable impedance value at a first input; inputting a fixed impedance value at a second input; and selecting one of the fixed impedance value and the variable impedance value in response to a selection signal, and outputting a first selected impedance value to a first pad termination circuit that provides the impedance of the first circuit pad termination in response to the first selected impedance value. A second selected impedance value is also generated, comprising: inputting the first selected impedance value at a third input; and outputting, in response to the first selected impedance value, a second selected impedance value to a second pad termination circuit that provides the impedance of the second pad termination in response to the second selected impedance value.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 6-1 is a schematic diagram of an embodiment of the first multiplexing unit of the pad termination circuits of FIGS. 3 and 4, in accordance with the present invention. FIG. 6-2 is a schematic diagram of a pass gate. FIG. 6-3 is a schematic diagram of a fuse-based option switch circuit in accordance with the present invention.

FIG. 11 is a table representing the operation of the second multiplexing unit of the pad termination circuit of FIG. 4, in accordance with the present invention.

DETAILED DESCRIPTION OF PREFERRED EMBODIMENTS

Figure 3:
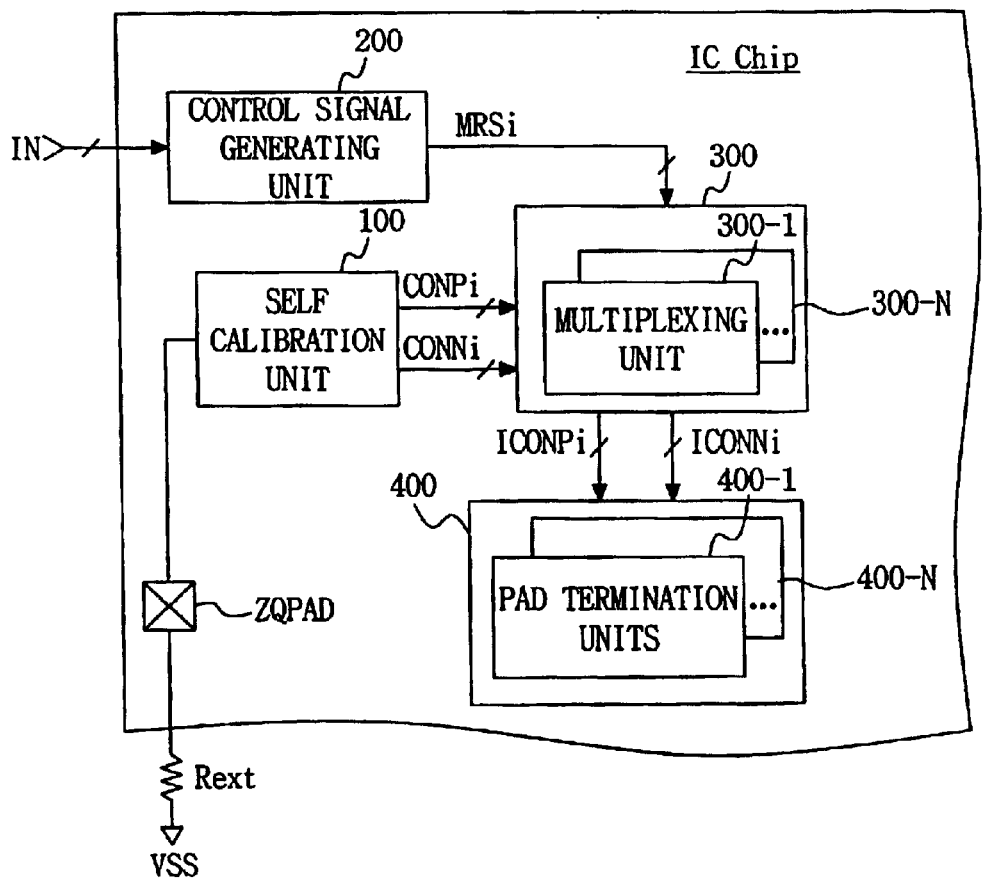
FIG. 3 is a block diagram of a first pad termination circuit in accordance with the present invention.

FIG. 3 is a block diagram of a circuit for on-die termination in an integrated circuit according to an embodiment of the present invention. Referring to FIG. 3, the integrated circuit (IC) chip includes a self-calibration unit 100, a control signal generating unit 200, a plurality of multiplexing units 300 including N-multiplexing components 300-1, . . . , 300-N, a plurality of pad termination circuit units 400, including pad termination circuit members 400-1, . . . , 400-N, and an external pad ZQPAD, connected to an external resistor Rext.

The self-calibration unit 100 has an input connected to the pad ZQPAD, and, in response to the signal received at the pad ZQPAD, generates a plurality of first self-calibration signals CONPi (where i is a natural number from 1 to n) and a plurality of second self-calibration signals CONNi (where i is a natural number from 1 to n). The control signal generating unit 200 receives a plurality of control inputs IN, and, in response, generates mode selection signals MRSi (where i is a natural number from 1 to m). The mode selection signals MRSi are employed by the multiplexing unit 300 to select between a plurality of termination modes.

The plurality of multiplexing units 300 receive as inputs the mode selection signals MRSi, the plurality of first self-calibration signals CONPi, and the plurality of second self-calibration signals CONNi. In response, the multiplexing units output a plurality of first pad termination control signals ICONPi (where i is a natural number from 1 to n) and a plurality of second pad termination control signals ICONNi (where i is a natural number from 1 to n). In this example, the first multiplexing unit 300-1 receives the mode selection signals MRSi, the first self-calibration signal CONP1, and the second self-calibration signal CONN1, and generates as outputs the first pad termination control signal ICONP1, and the second pad termination control signal ICONN1. The second through "N" 300-2 . . . 300-N multiplexing units receive and generate similar corresponding input and output signals. A plurality of pad termination circuit members 400-1 . . . 400-N provide pad termination for each corresponding input or output pad according to the generated pad termination control signals ICONPi and ICONNi.

Figure 4:
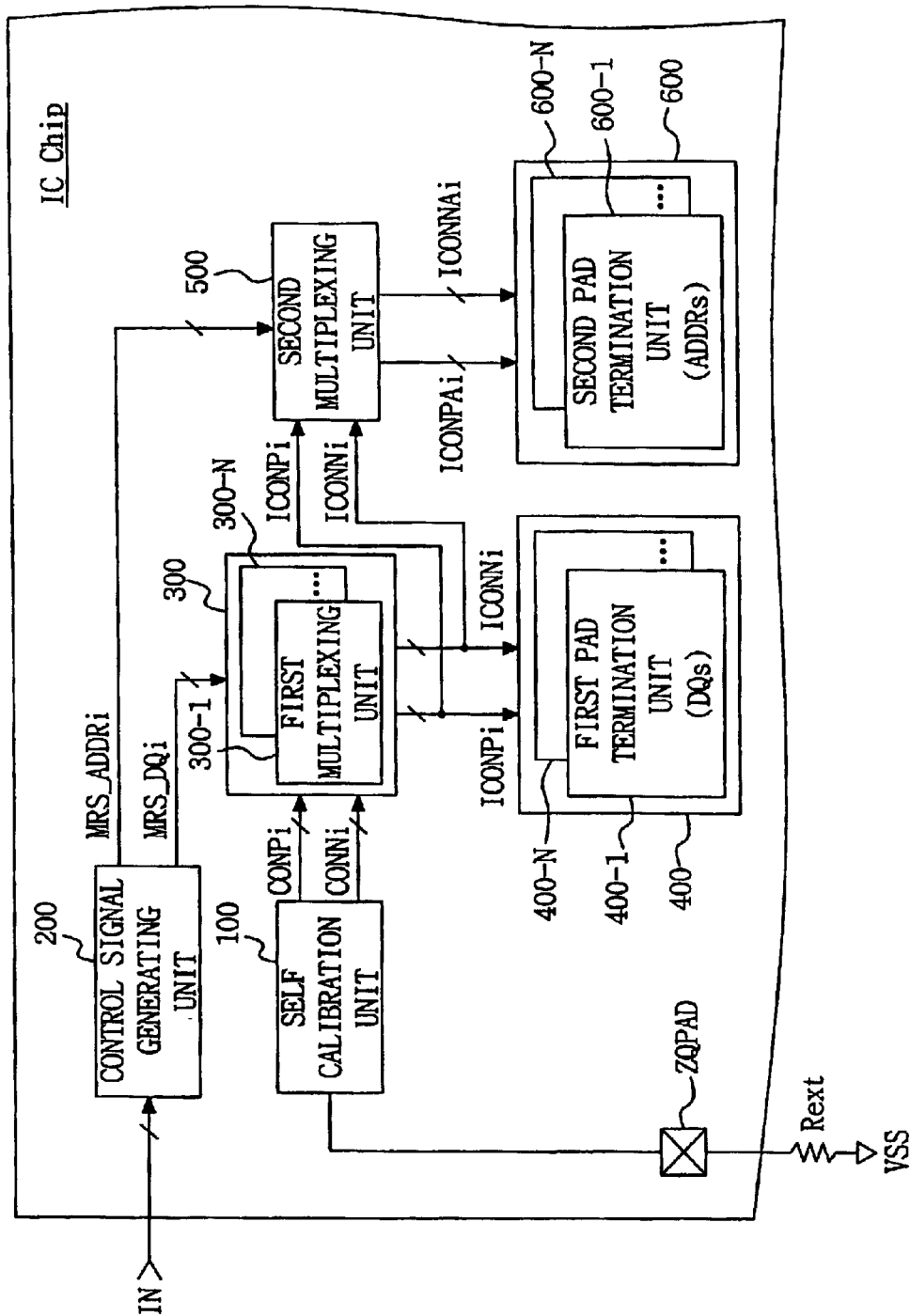
FIG. 4 is a block diagram of a second pad termination circuit in accordance with the present invention.

In the discussion to follow, the operation of each block will be initially explained, followed by a discussion of the operation of the circuits of FIGS. 3 and 4.

FIG. 4 is a block diagram of a second embodiment of the on-die termination circuit of the present invention. The structure of the FIG. 4 embodiment is similar to that of FIG. 3, except that the FIG. 4 embodiment further comprises a first multiplexing unit 300 and a second multiplexing unit 500. In this embodiment, the first multiplexing unit 300 handles selection of the termination values for data DQ lines, while the second multiplexing unit 500 handles selection of the termination values for address ADDR lines. This configuration is amenable to pad termination in circuits that include an address and data bus, since it is possible that loading on the address bus may be quite different than loading on the data bus, for example where the address bus is shared between multiple units and where the data bus may be a direct, localized connection between units.

In the embodiment of FIG. 4, the functionality of the first multiplexing unit 300 is the same as that of the multiplexing unit 300 of FIG. 3, except that the mode selection signals MRS input to the first multiplexing unit are specifically first mode selection signals for data bus termination MRS_DQi, and the output signals of the multiplexing unit in the form of first DQ pad termination signals ICONPi and second DQ pad termination signals ICONNi are provided to a data bus DQ pad termination unit 400.

The second multiplexing unit 500 inputs the plurality of first DQ pad termination control signals ICONPi, the plurality of second DQ pad termination control signals ICONNi, and second mode selection signals for address bus termination MRS_ADDRi (where i is a natural number from 1 to l), and, in response, outputs a plurality of first address bus ADDR pad termination control signals ICONPAi and a plurality of second address bus ADDR pad termination control signals ICONNAi. The first and second address bus ADDR pad termination control signals ICONPAi, ICONNAi in turn are provided to an address bus ADDR pad termination unit 600.

In the example of FIG. 4, the data bus DQ pad termination unit 400 terminates data bus signal lines with a first termination value, while the address bus ADDR pad termination unit 600 terminates data bus signal lines with a second termination value. The first and second termination values may be of different, or similar, values, depending on the application. This configuration applies equally well to other IC configurations that may have multiple signals with different termination characteristics, and is not limited to data signals and address signals.

Figure 5:
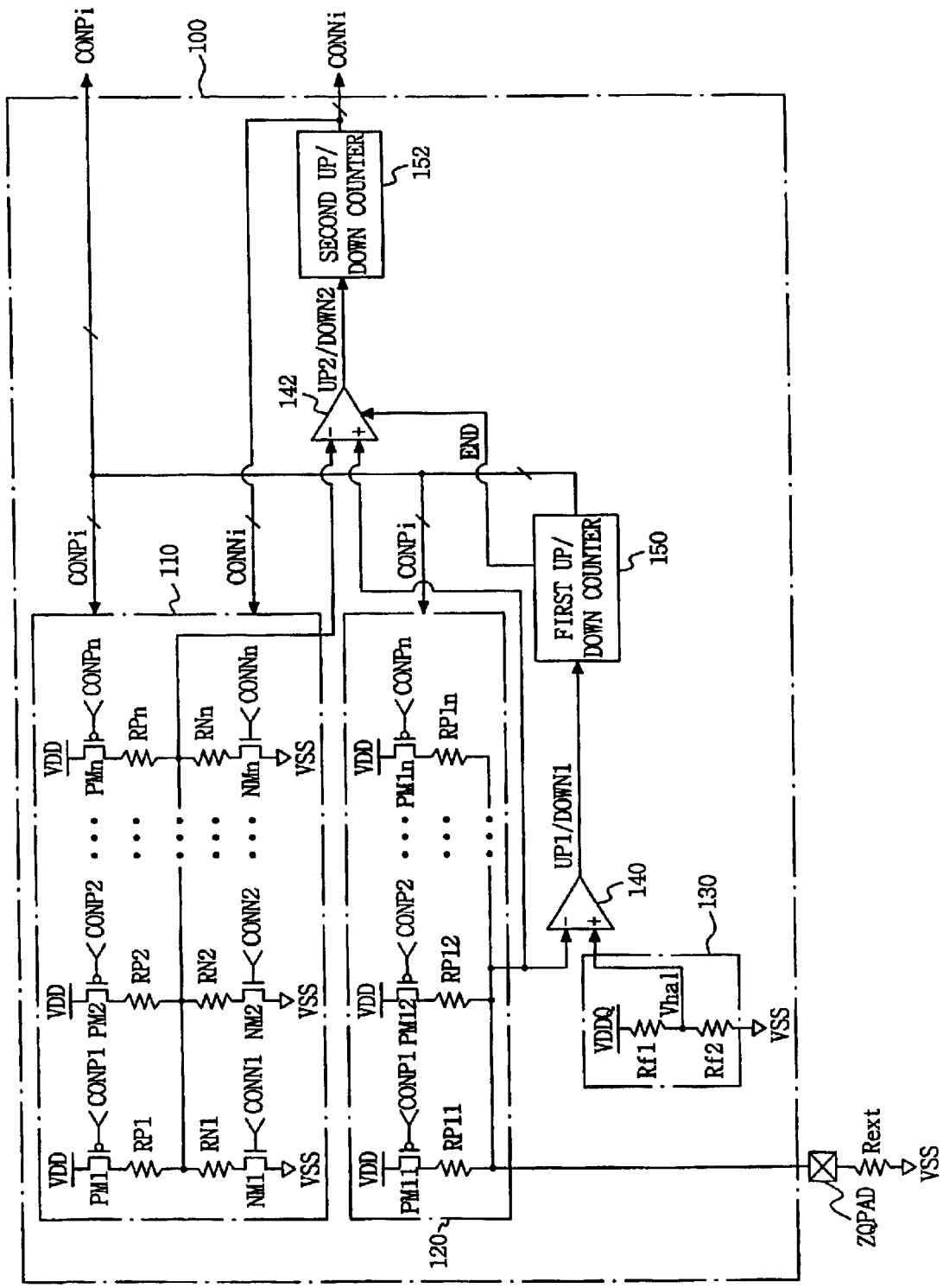
FIG. 5 is a schematic diagram of an embodiment of the self calibration unit of the pad termination circuits of FIGS. 3 and 4, in accordance with the present invention.

FIG. 5 is an example of the self-calibration unit 100 of FIGS. 3 and 4. The self-calibration unit 100 implements a self-calibration control operation and includes a first self-calibration control unit 110, a second self-calibration control unit 120, a reference voltage generation unit 130, a first comparator 140, a first up/down counter 150 which generates a plurality of first self-calibration signals CONPi to control the self-calibration operation, a second comparator 142, and a second up/down counter 152 which generates a plurality of second self-calibration signals CONNi to control the self-calibration operation. Initially, the second self-calibration control unit 120 operates, followed by operation of the first self-calibration control unit 110.

The operation of the self-calibration control unit will now be provided by way of example. Assume that the resistance value of an external resistor Rext connected to the calibration pad ZQPAD is 140 ohms. To obtain 70 ohms for impedance matching, a first comparator 140 compares the voltage at the pad ZQPAD with a voltage Vha1 generated by the reference voltage generation unit 130, and outputs counter signal UP1/DOWN1. The counter signal UP1/DOWN1 is provided to a first up/down counter 150. The first up/down counter 150 outputs a plurality of first self-calibration signals CONPi that activate/deactivate PMOS transistors PM11 . . . PM1n and PM1 . . . PMn in both the first self-calibration control unit 110 and the second self-calibration control unit 120.

If a first of the first self-calibration signals CONP1 is logic low, the first PMOS transistor PM1 in the first self-calibration control unit 110 is activated and the associated resistor RP1 is connected to a power supply VDD and used in terminating with the proper termination value for self calibration. If a second of the first self-calibration signals CONP2 is logic high, the second PMOS transistor PM2 in the first self-calibration control unit 110 is deactivated and the associated resistor RP2 is disconnected from the power supply VDD and is not used in generating a termination value for self calibration. The transistors PM11 ... PM1n of the second self-calibration control unit 110 are likewise activated and deactivated in response to the first self-calibration signals CONPi.

If the voltage of the pad ZQPAD matches that voltage Vha1 generated by the reference voltage generation unit 130, the first up/down counter 150 outputs an end signal END to the second comparator 142. At this point, the second comparator 142 becomes active and compares the voltage value generated by the first self-calibration control unit 110 with the voltage value at pad ZQPAD, and outputs count signal UP2/DOWN2 which is in turn input to a second up/down counter 152. The second up/down counter 152 outputs a plurality of variable control signals CONNi that, in turn, control the activation of NMOS transistors in the second self-calibration control unit 130.

If a first of the second self-calibration signals CONN1 is logic high, the first NMOS transistor NM1 is activated and associated resistor RN1 is connected to ground VSS and is used in terminating with the proper termination value for self-calibration. If a second of the second self-calibration signals CONN2 is logic low, NMOS transistor NM2 is deactivated and resistor RN2 is not connected to ground VSS and therefore is not part of the termination value. The respective self-calibration signals CONPi and CONNi are provided to the corresponding plurality of multiplexing units 300, 500 as shown in FIGS. 3 and 4.

Figure 1:
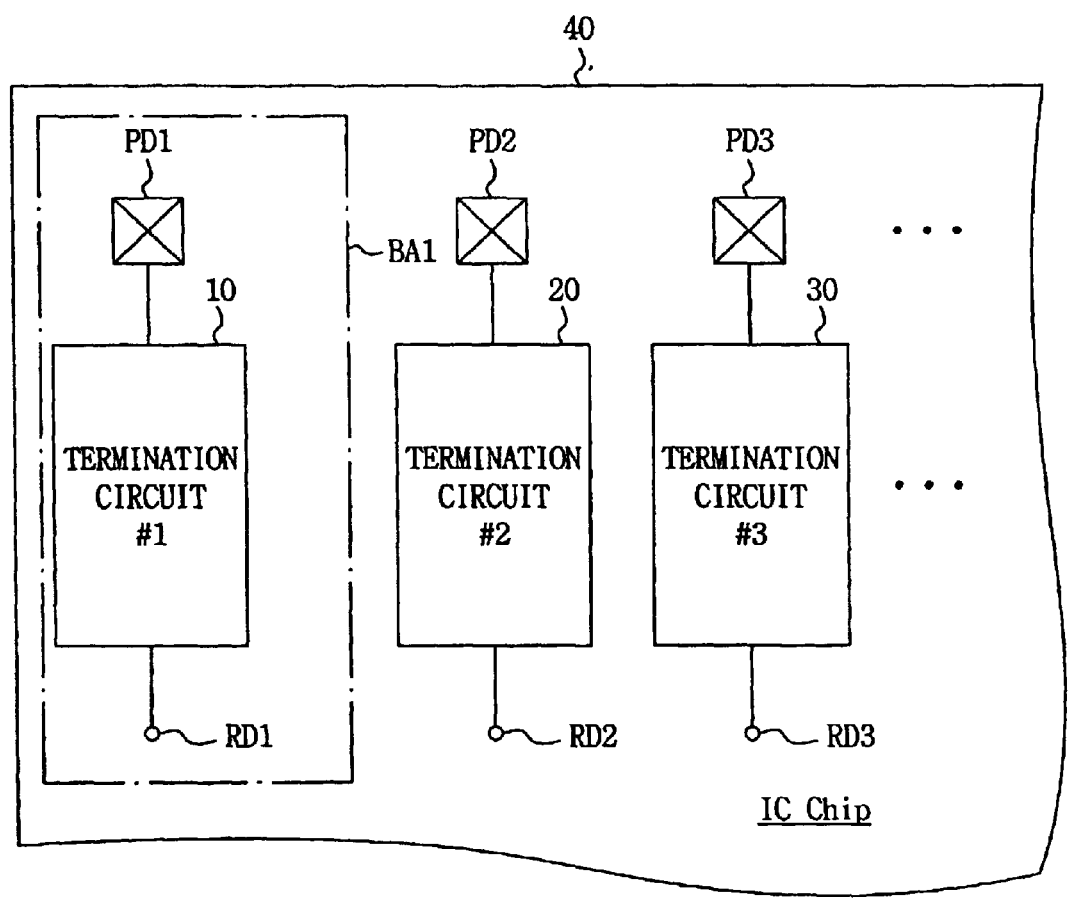
FIG. 1 is a block diagram of a conventional fixed-value pad termination circuit.
Figures 1, 6:
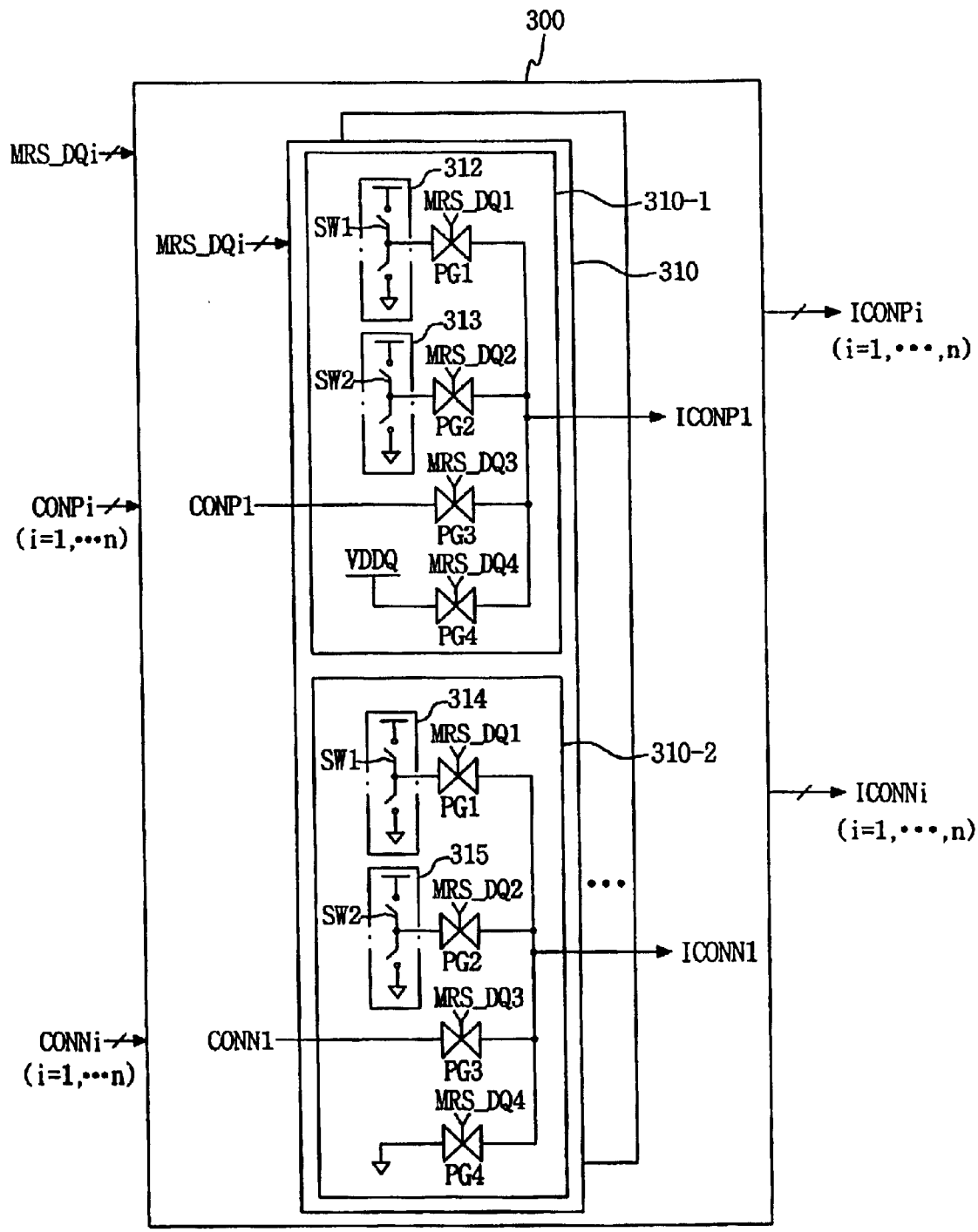
Figures 2, 6:
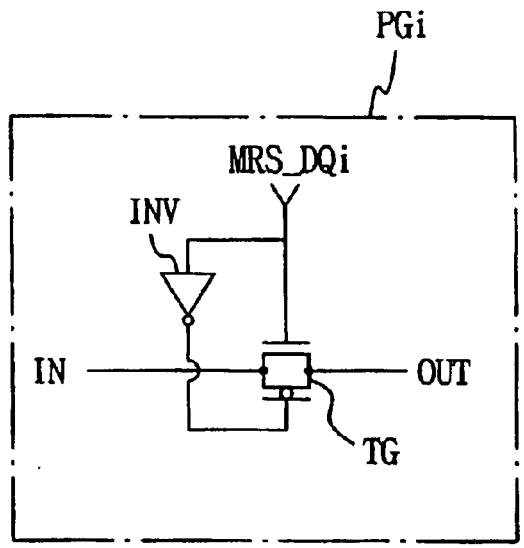
Figures 3, 6:
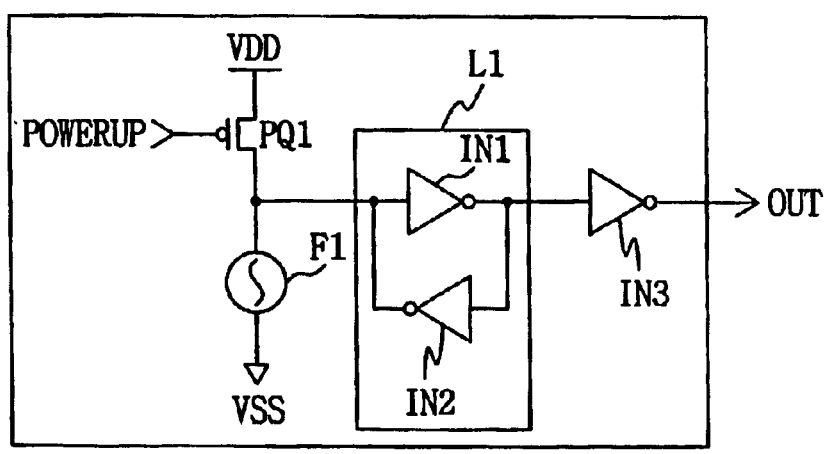

FIG. 6-1 is a schematic block diagram of an example of the plurality of multiplexing units 300 shown in FIGS. 3 and 4. The plurality of multiplexing parts 300 receive the mode selection signals MRS_DQi (i is a natural number from 1 to m) from the control signal unit 200, the plurality of self-calibration signals CONPi and CONNi from the self calibration unit 100, and, in response, outputs a plurality of first and second pad termination control signals ICONPi, ICONNi.

Each of the plurality of multiplexing units, for example the first multiplexing unit 300-1, includes a first sub-multiplexing unit 300-1A and a second sub-multiplexing unit 300-1B. The first multiplexing unit 300-1 receives the mode selection signals MRS_DQi and self-calibration signals CONP1 and CONN1, and outputs pad termination control signals ICONP1 and ICONN1. As shown in FIG. 6-1, the mode selection signals MRS_DQi may comprise four signals, including MRS_DQ1, MRS_DQ2, MRS_DQ3, and MRS_DQ4. Only one of the mode selection signals MRS_DQn is activated at a given time, and, in response, a corresponding pass gate PG1 ... PGn is activated and transmits a signal coupled to its input.

Figure 2:
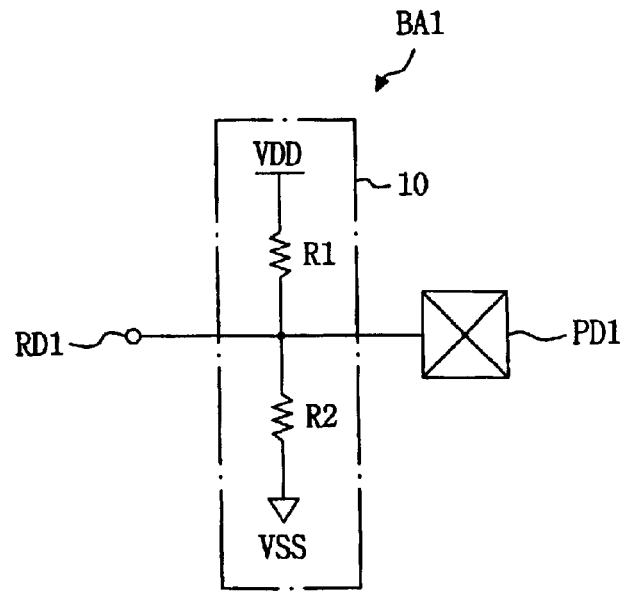
FIG. 2 is a schematic diagram of an example of a fixed-value resistor-based termination circuit for the circuit of FIG. 1.

An example of a pass gate circuit PG1 is shown in FIG. 6-2. The pass gate PG1 comprises a CMOS transistor pair TG, driven by a selection signal (in this case MRS_DQi) and having an inverter INV coupled between the gates of the CMOS pair as shown. In this manner, the pass gate PG1, when activated by the selection signal MRS_DQi passes the input signal IN as the output signal OUT.

If the first mode selection signal MRS_DQ1 is active, the first pass gate switch PG1 becomes active and transfers an output signal of a first option switch circuit 312. In this example, the output signal of the option switch circuit 312 is predetermined to have a value of logic low or logic high, depending on the state of switch SW1 of the option switch circuit 312. This value in turn determines the value of the first bit of the first default value of the first pad termination control signal ICONP1. If the second mode selection signal MRS_DQ2 is active, the second pass gate switch PG2 becomes active and transfers an output signal of a second option switch circuit 313. In this example, the output signal of the option switch circuit 313 is again predetermined to have a value of logic low or logic high, depending on the state of switch SW2 of the option switch circuit 313. This value in turn determines the value of the first bit of the second default value of the first pad termination control signal ICONP1.

If the third mode selection signal MRS_DQ3 is active, the third pass gate switch PG3 becomes active and, in this example, transfers the first bit of the first self-calibration signal CONP1 generated by the self-calibration unit 100 (see FIGS. 3 and 4). The first bit of the first self-calibration signal CONP1 itself is then transferred to the output of the third pass gate PG3, to become the first bit of the first pad termination control signal ICONP1. In this manner, using self calibration, the first self-calibration signal CONP1 can be changed automatically according to the value determined by the self-calibration unit 100.

Figure 7:
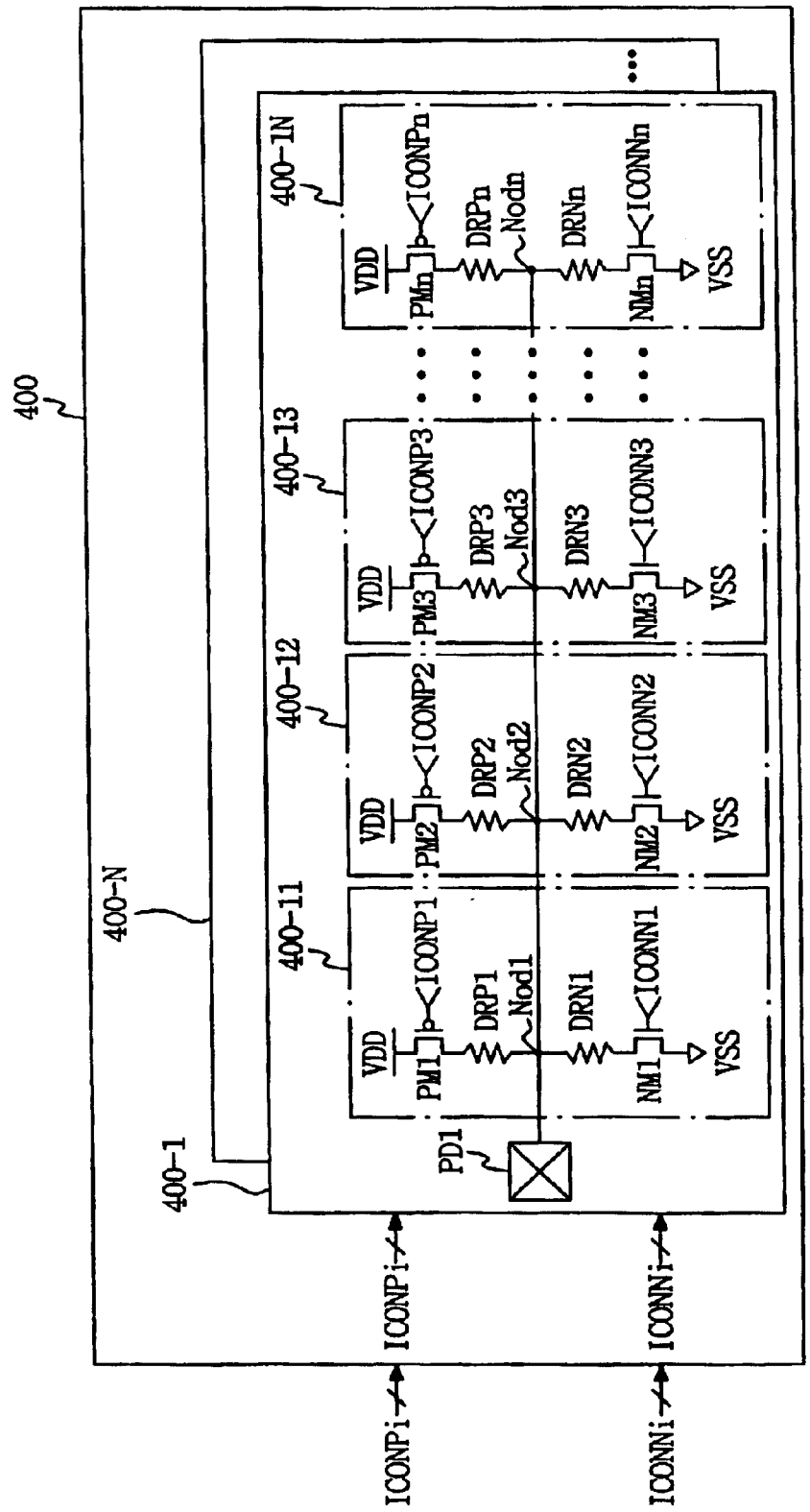
FIG. 7 is a schematic diagram of the pad termination units of the circuits of FIGS. 3 and 4, in accordance with the present invention.

If the fourth mode selection signal MRS_DQ4 is active, the fourth pass gate switch PG4 becomes active and, in this example, transfers a logic high voltage value (for example power supply value VDD) to become the first bit of the first pad termination control signal ICONP1. In this manner, according to this selection, the first bit of the first pad termination control signal ICONP1 is fixed at a logic high value. This setting provides for a deactivation mode in the termination configuration of the present invention. Assuming that the ICONPi signal is coupled to a resistor bank in the first pad termination unit having PMOS gates, as shown in FIG. 7, then, assuming deactivation mode is the current mode, the resistors DRP1 ... DRPn in the resistor bank are all disconnected from the power source VDD and therefore termination is deactivated.

The operation of the second sub-multiplexing unit 300-1B is similar to that of the first sub-multiplexing unit 310-1A, with the exception being the operation of the mode selection signal MRS_DQ4. Assuming the first or second mode selection signal MRS_DQ1, MRS_DQ2 is in operation, then the second pad termination control signal ICONNi receives the value programmed according to the state of switch 314 or 315. Assuming the third mode selection signal MRS_DQ3 is in operation, then the second pad termination control signal ICONNi receives a value determined by the self calibration signal CONNi.

If the fourth mode selection signal MRS_DQ4 is active, a fourth switch PG4 becomes active and transfers a ground signal VSS as the first bit of the second pad termination control signal ICONN1. In this manner, according to this selection, the first bit of the first pad termination control signal ICONP1 is fixed at a logic high value. This setting provides for a deactivation mode in the termination configuration of the present invention. Assuming that the ICONNi signal is coupled to a resistor bank in the first pad termination unit having NMOS gates, as shown in FIG. 7, then, assuming deactivation mode is the current mode, the resistors DRN1 ... DRNn in the resistor bank are all disconnected from the ground source VSS and therefore termination is deactivated.

FIG. 6-3 is a schematic diagram of the option switch circuits 312–315 of FIG. 6-1. Each option switch circuit generating an output signal OUT includes PMOS transistors (NMOS transistors can optionally be employed), a fuse F1, a latch circuit L1 comprising first and second inverters IN1 and IN2, and a third inverter IN3. A power-up signal POWERUP initiates from a ground value VSS to a voltage source value VDD at application of power to the IC. If the fuse F1 is not cut, the drain node of the PMOS transistor PQ1 is logic low. The latch circuit L1 latches logic low, outputs logic high and inverter IN3 outputs the output signal OUT as logic low. If the fuse F1 is cut, the drain node of PQ1 is logic high according to the starting voltage VSS of power-up signal POWERUP. The latch circuit L1 latches logic high, outputs logic low and inverter IN3 outputs the output signal OUT as logic high. The output signal is then transferred as the first or second pad termination control signal ICONPi or ICONNi according to the state of the first or second mode selection signal MRS_DQ1, MRS_DQ2. In this manner, the first or second pad termination control signals ICONPi or ICONNi can be programmed to first or second default values, according to the state of the fuses F1. In alternative embodiments, other forms of option switch circuits can be employed, including, metal layer switching circuits, pad bonding circuits, and the like. The number of default modes having such fixed values can vary, according to the number of available mode selection signals MRS_DQi.

FIG. 7 is a schematic diagram of an embodiment of the pad termination units 400, 600 of FIGS. 3 and 4. The pad termination unit 400 includes individual pad termination circuits 400-1, . . . , 400-N, each corresponding to a pad PD1, PD2, . . . PDk (where k is the number of pads).

The pad termination circuit 400-1 receives the first and second pad termination control signals ICONPi and ICONNi in the form of binary signals. The first pad termination control signals ICONPi are connected to the gates of the PMOS transistors, and the second pad termination control signals ICONNi are connected to the gates of the NMOS transistors. According to the logic value of the pad termination control signals ICONPi and ICONNi, resistors DRP1, DRP2, . . . , DRPn, DRN1, DRN2, . . . , DRNn are selectively activated and deactivated, and the activated resistors are used to terminate the signal at the corresponding pad PD1.

Each pad termination circuit 400-1 includes a plurality of variable termination units 400-11, 400-12, 400-13, . . . , 400-1N. Each of the variable termination units 400-11, 400-12, 400-13, . . . , 400-1N is connected to a common node Nod1, Nod2, Nod3, . . . , Nodn respectively, that are each, in turn, connected to the pad PD1. Each variable termination unit 400-11 . . . 400-1N includes a PMOS transistor PMn, an NMOS transistor NMn, and resistors DRPn, and DRNn which are connected, respectively between the pad PDn and the voltage source VDD and ground VSS. In this configuration, each bit of the pad termination control signals ICONP1 and ICONN1 have an opposite logical value such that both termination resistors in a given pair of a variable termination unit, i.e. resistors DRP1, DRN1 of unit 400-11, are activated or deactivated simultaneously. However, in certain applications, the pad termination control signals ICONP1 and ICONN1 may optionally have logic high or low values that are independent of each other.

In one example, the value of resistors DRP2, DRN2 in the variable termination unit 400-12 is twice the value of resistors DRP1, DRN1 in variable termination unit 400-11. Similarly, the value of resistors DRP3, DRN3 in variable termination unit 400-13 is twice the value of resistors DRP2, DRN2 in variable termination unit 400-12. In view of this combination of resistance values, a variety of combinations of resistance values can be made, according to the binary values of the pad termination control signals ICONP1 and ICONN1. For example, assume the resistance value of the resistors DRP1, DRN1 in variable termination unit 400-11 to be 60 ohms, and assume the value of resistors DRP2, DRN2 in variable termination unit 400-12 to be 60 ohms. If only the first bit of the first pad termination control signal ICONP1 is logic low and only the first bit of the second pad termination control signal ICONN1 is logic high, in other words, only one of the variable termination units, namely unit 400-11, is used for termination, then the termination resistance of pad PD1 has a parallel sum of 30 ohms $(=1/[\frac{1}{60}]+[\frac{1}{60}])$. Similarly, if only the second bit of the first pad termination control signal ICONP2 is logic low and only the second bit of the second pad termination control signal ICONN2 is logic high, in other words, only one of the variable termination units, namely unit 400-12, is used for termination, then the termination resistance of pad PD1 has a parallel sum of 60 ohms $(=1/[\frac{1}{120}]+[\frac{1}{120}])$. Similarly, if only the first and second bits of the first pad termination control signal ICONP1, ICONP2 are logic low and only the first and second bits of the second pad termination control signal ICONN1, ICONN2 are logic high, in other words, only two of the variable termination units, namely units 400-11, 400-12, are used for termination, then the termination resistance of pad PD1 has a parallel sum of 20 ohms $(=1/[\frac{1}{60}]+[\frac{1}{60}]+[\frac{1}{120}]+[\frac{1}{120}])$.

With reference to FIG. 4, the configuration of the second pad termination unit 600 can be similar to that of the first pad termination unit 400, with the exception being that the second pad termination unit receives first and second address bus ADDR pad termination control signals ICONPAi, ICONNAi from the second multiplexing unit 500. Operation of the second termination unit 600 is similar to that of the first termination unit 400.

Figure 8:
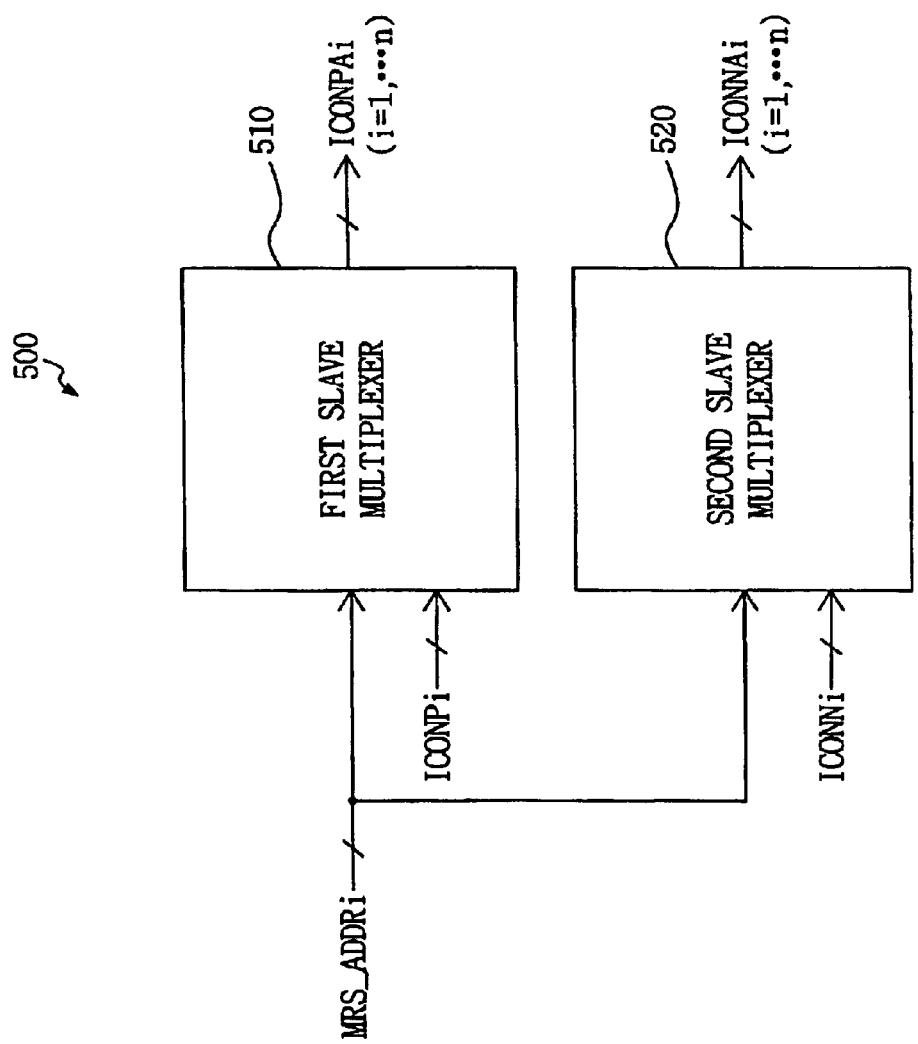
FIG. 8 is a block diagram of an embodiment of the second multiplexing unit of the pad termination circuit of FIG. 4, in accordance with the present invention.

FIG. 8 is a block diagram of the second multiplexing unit 500 of FIG. 4. In this example, the second multiplexing unit 500 includes a first slave multiplexer 510 and a second slave multiplexer 520. The inputs to the first slave multiplexer 510 include second mode selection signals MRS_ADDRi, and the plurality of first pad termination control signals ICONPi generated by the first multiplexing unit 500. In response, the first slave multiplexer 510 outputs first address pad termination control signals ICONPAi (where i is a natural number from 1 to n). The inputs to the second slave multiplexer 520 include the second mode selection signals MRS_ADDRi, and the plurality of second pad termination control signals ICONPi generated by the first multiplexing unit 300. In response, the second slave multiplexer 510 outputs second address pad termination control signals ICONNAi (where i is a natural number from 1 to n).

Figure 9:
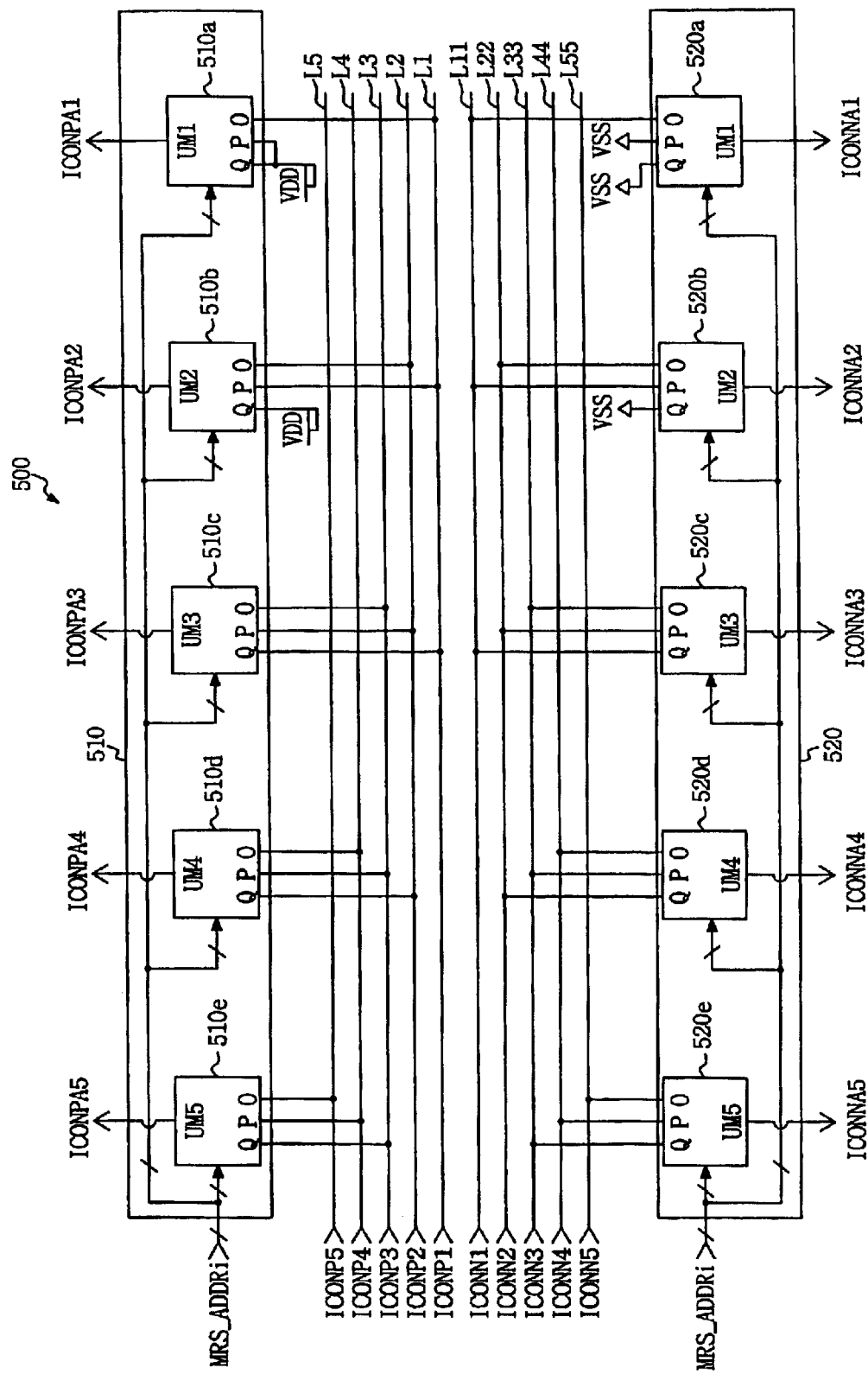
FIG. 9 is a schematic diagram of an embodiment of the second multiplexing unit of the pad termination circuit of FIG. 4, in accordance with the present invention.

FIG. 9 is a detailed schematic diagram of the second multiplexing unit 500 of FIGS. 4 and 8. The second multiplexing unit 500 comprises the first and second slave multiplexers 510 and 520. The first slave multiplexer 510 outputs the plurality of first address pad termination control signals ICONPAi for controlling the PMOS transistors PMn in the second pad termination circuit members 600 of FIG. 4. The second slave multiplexer 520 outputs the plurality of second address pad termination control signals ICONNAi for controlling the NMOS transistors NMn in the second pad termination circuit members 600 of FIG. 4.

The first slave multiplexer 510 includes a plurality of unit multiplexers 510*a*, 510*b*, 510*c*, 510*d*, and 510*e*. It is assumed for the purpose of explanation that the number of unit multiplexers is five. The five first data pad termination control signals ICONP1, ICONP2, ICONP3, ICONP4, and ICONP5 generated by the first multiplexing unit 300 are connected to the unit multiplexers 510a, 510b, 510c, 510d, and 510e in the first slave multiplexer 510 via lines L1 to L5 according to a shifting connection configuration. In other words, the input terminal O of the first unit multiplexer 510a is connected to line L1, the input terminal O of the second unit multiplexer 510b is connected to line L2, the input terminal O of the third unit multiplexer 510c is connected to line L3, and the like. Since the first slave multiplexer 510 controls the operation of PMOS transistors, input terminals P and Q of unit multiplexer 510a and input terminal Q of unit multiplexer 510b are connected to a logic high value via power supply VDD.

The second data pad termination control signals ICONN1, ICONN2, ICONN3, ICONN4, and ICONN5 generated by the first multiplexing unit 300 are connected to the unit multiplexers 520a, 520b, 520c, 520d, and 520e in the second slave multiplexer 520 via lines L11 to L55 according to a shifting connection configuration. In other words, the input terminal O of the first unit multiplexer 520a is connected to line L11, the input terminal O of the second unit multiplexer 520b is connected to line L22, the input terminal O of the third unit multiplexer 530c is connected to line L33, and the like. Since the second slave multiplexer 520 controls the operation of NMOS transistors, input terminals P and Q of unit multiplexer 520a and input terminal Q of unit multiplexer 520b are connected to a logic low value via ground VSS.

Figures 1, 10:
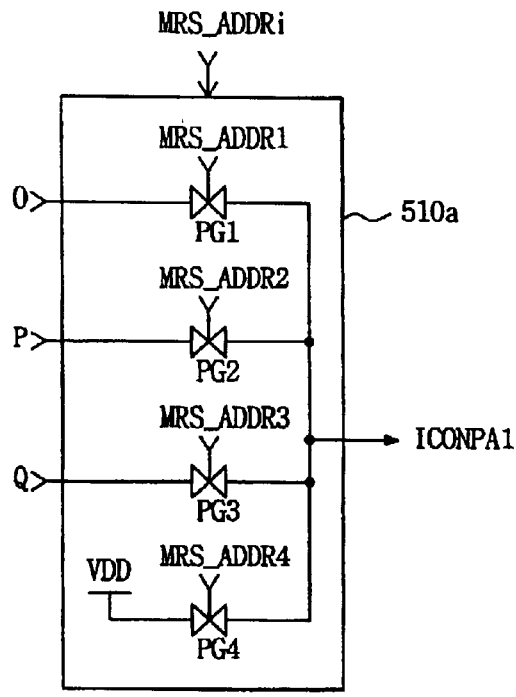
FIG. 10 is a representative diagram of the programming of the second multiplexing unit of the pad termination circuit of FIG. 4, in accordance with the present invention.
Figures 2, 10:
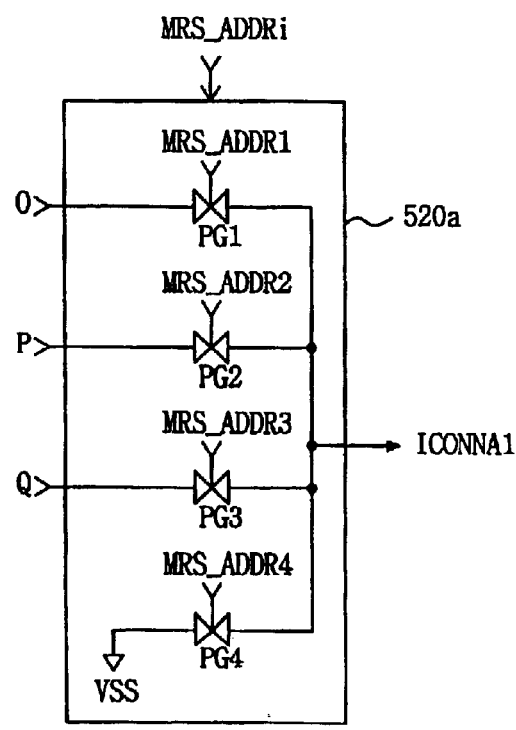

FIG. 10-1 and FIG. 10-2 are representative block diagrams of the slave multiplexers 510a, 520a of FIG. 9. Assuming the first mode selection signal MRS_ADDR1 is active, the input signal of the input terminal O is selected to be transferred through the unit multiplexers 510a and 520a as the second address pad termination control signals ICONPA1, ICONNA1. If the second mode selection signal MRS_ADDR2 is active, the input signal of the input terminal P is selected to be transferred through the unit multiplexers 510a and 520a as the second address pad termination control signals ICONPA1, ICONNA1. If the third mode selection signal MRS_ADDR3 is active, the input signal of the input terminal Q is selected to be transferred through the unit multiplexers 510a and 520a as the second address pad termination control signals ICONPA1, ICONNA1. If the fourth mode selection signal MRS_ADDR4 is active, deactivation mode is enabled, and the output of unit multiplexer 510a is fixed to be logic high and the output of the unit multiplexer 520a is fixed to be logic low.

The operation of the second multiplexing unit 500 will now be described with reference to the table of FIG. 11. In this example, assume that the value of resistors DRP2, DRN2 in the second variable termination unit 400-12 in FIG. 7 is twice the value of resistors DRP1, DRN1 in the first variable termination unit 400-11, and that the value of resistors DRP3, DRN3 in the third variable termination unit 400-13 is twice the value of resistors DRP2, DRN2 in the second variable termination unit 400-12, etc. Assume also that the logical values of the first data pad termination control signals ICONP1 to ICONP5 output by the first multiplexing unit 300 are '01111'.

As shown in FIG. 11, if the first mode selection signal MRS_ADDR1 is active, then the plurality of first address pad termination control signals ICONPAi are output as '01111' and the plurality of second address pad termination control signals ICONNAi are output as '10000', in other words, the same value as the inputs ICONPi, ICONNi. In this case, assuming that the resistance values of the first pad termination unit 400 are the same as the resistance values of the second pad termination unit 600, then the resulting termination value of the second (ADDR) pad termination unit 600 is the same as the termination value of the first (DQ) pad termination unit 400.

If the second mode selection signal MRS_ADDR2 is active, then the plurality of first address pad termination control signals ICONPAi are output as '10111' and the plurality of second address pad termination control signals ICONNAi are output as '01000', or, in other words, twice the value of the inputs ICONPi, ICONNi. In this case, assuming that the resistance values of the first pad termination unit 400 are the same as the resistance values of the second pad termination unit 600, then the resulting termination value of the second (ADDR) pad termination unit 600 is twice that of the first (DQ) pad termination unit 400. For example, If the termination value of the first pad termination unit 400 is set to be 30 ohms, then the termination value of the second pad termination circuit member 600 is set to be 60 ohms.

If the third mode selection signal MRS_ADDR3 is active, then the plurality of first address pad termination control signals ICONPAi are output as '11011' and the plurality of second address pad termination control signals ICONNAi are output as '00100', or in other words, four times the value of the inputs ICONPi, ICONNi. In this case, assuming that the resistance values of the first pad termination unit 400 are the same as the resistance values of the second pad termination unit 600, then the resulting termination value of the second (ADDR) pad termination unit 600 is four times that of the first (DQ) pad termination unit 400. For example, If the termination value of the first pad termination unit 400 is set to be 30 ohms, then the termination value of the second pad termination circuit member 600 is set to be 120 ohms.

If the fourth mode selection signal MRS_ADDR4 is active, then the plurality of first address pad termination control signals ICONPAi and second address pad termination control signals ICONNAi are output as all logic high and all logic low respectively, regardless of the state of the inputs ICONPi, ICONNi. In this state, deactivation mode is active, and the resistors of the termination units are not employed in terminating the corresponding bonding pads.

Returning to FIG. 4, the operation of the pad termination control circuit of the present invention will now be described. Control signal generating unit 200 receives an external input IN, and, in response, generates the data and address mode selection signals MRS_DQi, MRS_ADDRi. The external input may comprise, for example, a mode register set (MRS) command commonly implemented in dynamic random access memories (DRAMs) used for setting the operation modes of a DRAM. An example of the MRS command being used for setting data burst length is disclosed in U.S. Pat. No. 5,923,595, incorporated herein by reference. Usually, several modes can be set by coding inputting addresses which are input elements corresponding to the MRS command. This address is referred to as the 'key address' for the MRS command. MRS signals are generated by the control signal generating unit 200 based on the received external MRS command.

In the example embodiment provided above, there are two distinct MRS signals; namely MRS_DQi and MRS_ADDRi. As shown in FIG. 11, MRS_DQi may be represented by four decoded signals coded by key addresses ADDR3 and ADDR2, while MRS_ADDRi may be represented by four decoded signals coded by key addresses ADDR1 and ADDR0.

Assuming the key address codes ADDR3 and ADDR2 to be set as 0 and 0 respectively, then the mode selection signal MRS_DQ4 activates only the fourth pass gate switch PG4, and the first pad termination control signals ICONPi, ICONNi are accordingly fixed at logic high and logic low values respectively. Accordingly, the PMOS transistors and NMOS transistors of the first pad termination circuit member are deactivated. This is referred to as the deactivation termination mode since all resistors in the pad termination unit are deactivated.

Assuming the key address codes ADDR3 and ADDR2 to be set as 0 and 1 respectively, then the mode selection signal MRS_DQ3 activates only the third pass gate switch PG3, and the first pad termination control signals ICONPi, ICONNi are set in response to the self-calibration signals CONPi and CONNi generated by the self-calibration unit 100. Accordingly, the PMOS transistors and NMOS transistors of the first pad termination circuit member 400 activate and deactivate in response to the self-calibration signals CONPi, and CONNi of the self-calibration unit 100. This mode is referred to as the self-calibration mode of termination.

Assuming the key address codes ADDR3 and ADDR2 to be set as 1 and 0 respectively, then the mode selection signal MRS_DQ2 activates only the second pass gate switch PG2, and the first pad termination control signals ICONPi, ICONNi are set in response to the fuse option switch circuits 313, 315. Accordingly, the PMOS transistors and NMOS transistors of the first pad termination circuit member 400 activate and deactivate in response to the state of the fuse option switch circuits 313, 315. This mode is referred to as the second default termination mode.

Assuming the key address codes ADDR3 and ADDR2 to be set as 1 and 1 respectively, then the mode selection signal MRS_DQ1 activates only the first pass gate switch PG1, and the first pad termination control signals ICONPi, ICONNi are set in response to the fuse option switch circuits 312, 314. Accordingly, the PMOS transistors and NMOS transistors of the first pad termination circuit member 400 activate and deactivate in response to the state of the fuse option switch circuits 312, 314. This mode is also referred to as the first default termination mode. By selectively cutting different fuses for the first and second default termination modes, different fixed predetermined termination values can be selected by selecting between the different modes. Additional default termination modes can be added by expanding the number of mode selection lines MRS_DQn.

In this manner, the state of the mode selection signal MRS_DQi controls the termination value of the first pad termination unit 400, which may include pads for the clock signal, data strobe signal, data lines, and the like. Clock signals at the clock pad are used for synchronizing most of the input commands of DRAMs. The data strobe signal at the data strobe signal pad is used for synchronizing data input and data output. Data signals at the data pads correspond to data input and data output.

Assuming the key address codes ADDR1 and ADDR0 to be set as 0 and 0 respectively, then the mode selection signal MRS_ADDR4 activates only the fourth pass gate switch PG4, and the first pad termination control signals ICONPAi, ICONNAi are accordingly fixed at logic high and logic low values respectively. Accordingly, the PMOS transistors and NMOS transistors of the second pad termination circuit member are deactivated. This is referred to as the deactivation termination mode since all resistors in the pad termination unit are deactivated.

Assuming the key address codes ADDR1 and ADDR0 to be set as 0 and 1 respectively, then the mode selection signal MRS_ADDR3 activates only the third pass gate switch PG3, and second pad termination control signals ICONPAi, ICONNAi are set in response to the first pad termination control signals CONPi and CONNi generated by the first multiplexing unit 300. As explained above, the resulting termination value of the second pad termination unit 600 is 4 times that of the first pad termination unit 400.

Assuming the key address codes ADDR1 and ADDR0 to be set as 1 and 0 respectively, then the mode selection signal MRS_ADDR2 activates only the second pass gate switch PG2, and second pad termination control signals ICONPAi, ICONNAi are set in response to the first pad termination control signals CONPi and CONNi generated by the first multiplexing unit 300. As explained above, the resulting termination value of the second pad termination unit 600 is 2 times that of the first pad termination unit 400.

Assuming the key address codes ADDR1 and ADDR0 to be set as 1 and 1 respectively, then the mode selection signal MRS_ADDR1 activates only the first pass gate switch PG1, and second pad termination control signals ICONPAi, ICONNAi are set in response to the first pad termination control signals CONPi and CONNi generated by the first multiplexing unit 300. As explained above, the resulting termination value of the second pad termination unit 600 is the same as that of the first pad termination unit 400.

In this manner, the state of the mode selection signal MRS_ADDRi controls the termination value of the second pad termination unit 600, which may include pads for command signals, address signals, and the like. Command signals include the chip select signal CSB, the row address strobe signal RASB, the column address strobe signal CASB, and the write enable signal WEB, etc. Address signals include row address and column address signals.

The present invention therefore allows for multiple modes of termination, including a fixed value that is preprogrammed, and a variable value that can, for example, be measured and determined by a self-calibration circuit. The present invention also provides for the possibility of multiple termination values within a single device. This is especially applicable for devices that have different loadings for address and data signals, for example in a configuration having a common, shared address bus, and multiple, localized data buses. For example, in the case of a single IC divided to two or more inner chips, the termination values of the corresponding pads can be set differently. Also, in the case where there are several banks of cell arrays, the variable termination approach can be employed for each divided bank. The present invention is also applicable to multi-bank chip and multi-chip system applications.

In addition, with reference to the embodiments of FIG. 4, the second multiplexing unit 500 may be independent of the output of the first multiplexing unit 300. In this case, the second multiplexing unit may directly receive the self-calibration signals CONPi and CONNi from the self calibration unit 100, or alternatively may include its own independent self calibration unit for generating such self calibration signals.

In other embodiments, multiple multiplexing units 300, 500 may be employed for independently programming the termination values at each individual pad termination unit 400, rather than assigning a single termination value to each grouping of pads, for example the address and data groups, as described above.

While this invention has been particularly shown and described with references to preferred embodiments thereof, it will be understood by those skilled in the art that various changes in form and details may be made herein without departing from the spirit and scope of the invention as defined by the appended claims.

I claim:

1. A control circuit for controlling the impedance of a pad termination comprising:
    a first input for inputting a variable impedance value;
    a second input for inputting a fixed impedance value; and
    a selector for selecting one of the fixed impedance value and the variable impedance value in response to a selection signal, and for outputting a selected impedance value to a pad termination circuit that provides the impedance of the pad termination in response to the selected impedance value.

2. The control circuit of claim 1 wherein the fixed impedance value is generated in response to an open or closed state of a fuse, hard-wired state, or bonding state.

3. The control circuit of claim 1 wherein the fixed impedance value comprises a first fixed impedance value and further comprising a third input for inputting a second fixed impedance value, and wherein the selector selects one of the first fixed impedance value, the second fixed impedance value and the variable impedance value in response to the selection signal, and outputs the selected impedance value to the pad termination circuit.

4. The control circuit of claim 1 further comprising a fourth input for inputting a deactivation impedance value, and wherein the selector selects one of the fixed impedance value, the variable impedance value, and the deactivation impedance value in response to the selection signal, and outputs the selected impedance value to the pad termination circuit.

5. The control circuit of claim 4 wherein the pad termination circuit applies the deactivation impedance value by removing the applied impedance.

6. The control circuit of claim 1 wherein the selector comprises a multiplexer.

7. The control circuit of claim 1 wherein the variable impedance value is generated by a self-calibration circuit.

8. The control circuit of claim 7 wherein the self-calibration circuit comprises:
    a reference node that is coupled to a bonding pad having a reference impedance;
    a first comparator having a first input coupled to the reference node and a second input coupled to a reference voltage, the comparator comparing the first input and the second input to generate a comparison output;
    a plurality of impedance loads in parallel between the reference node and a first reference voltage; the plurality of impedance loads being selectively activated in response to the comparison output to provide a combined impedance that substantially matches the reference impedance.

9. The control circuit of claim 1 wherein the fixed and variable impedance values comprise a plurality of binary bits.

10. The control circuit of claim 9 wherein the pad termination circuit comprises a bank of resistors, individually selectable according to the binary bits of the fixed or variable impedance values.

11. The control circuit of claim 10 wherein the plurality of resistors have resistance values that are binary multiples of each other and are connected to a common node that is coupled to a bonding pad, and wherein the impedance of the pad termination is determined by the combined selected resistance values.

12. The control circuit of claim 1 wherein the selected impedance value comprises a first selected impedance value and further comprising a second selector for receiving the first selected impedance value, and for outputting a second selected impedance value to a second pad termination circuit that provides a second impedance of a second pad termination in response to the second selected impedance value.

13. The control circuit of claim 12 wherein the second selected impedance value is one of the same as the first selected impedance value, a multiple of the first selected impedance value, a deactivation value, or is independent of the first selected impedance value.

14. The control circuit of claim 12 wherein one of the first selected impedance value and second selected impedance value is used for termination of one of data and address pads and the other of the first selected impedance value and second selected impedance value is used for termination of the other of data and address pads.

15. The control circuit of claim 14 wherein at least one of the first and second selected impedance values is further used for termination of command signal pads.

16. The control circuit of claim 15 wherein the command signal pads comprise pads for at least one of a chip select signal (CSB), a row address signal (RASB), a column address strobe signal (CASB) and a write enable signal (WEB).

17. The control circuit of claim 1 wherein the selection signal is generated in response to a mode register set (MRS) command used for setting the operation mode of a memory device.

18. The control circuit of claim 1 wherein the impedance value comprises pull-up and pull-down impedance values.

19. A control circuit for controlling the impedance of a pad termination at first and second circuit pads comprising:
    a first circuit for generating a first selected impedance value comprising:
        a first input for inputting a variable impedance value;
        a second input for inputting a fixed impedance value; and
        a first selector, for selecting one of the fixed impedance value and the variable impedance value in response to a selection signal, and for outputting a first selected impedance value to a first pad termination circuit that provides the impedance of the first circuit pad termination in response to the first selected impedance value; and
    a second circuit for generating a second selected impedance value comprising:
        a third input for inputting the first selected impedance value; and
        a second selector, for outputting, in response to the first selected impedance value, a second selected impedance value to a second pad termination circuit that provides the impedance of the second pad termination in response to the second selected impedance value.

20. The control circuit of claim 19 wherein the second selected impedance value is one of the same as the first selected impedance value, a multiple of the first selected impedance value, a deactivation value, or is independent of the first selected impedance value.

21. The control circuit of claim 19 wherein one of the first selected impedance value and second selected impedance value is used for termination of one of data and address pads and the other of the first selected impedance value and second selected impedance value is used for termination of the other of data and address pads.

22. The control circuit of claim 21 wherein at least one of the first and second selected impedance values is further used for termination of command signal pads.

23. The control circuit of claim 22 wherein the command signal pads comprise pads for at least one of a chip select signal (CSB), a row address signal (RASB), a column address strobe signal (CASB) and a write enable signal (WEB).

24. The control circuit of claim 19 wherein the selection signal is generated in response to a mode register set (MRS) command used for setting the operation mode of a memory device.

25. The control circuit of claim 19 wherein the second selector further outputs the second selected impedance value in response to a second selection signal.

26. The control circuit of claim 25 wherein the second selection signal is generated in response to a mode register set (MRS) command used for setting the operation mode of a memory device.

27. The control circuit of claim 19 wherein the fixed impedance value comprises a first fixed impedance value and wherein the first circuit further comprises a fourth input for inputting a second fixed impedance value, and wherein the selector selects one of the first fixed impedance value, the second fixed impedance value and the variable impedance value in response to the selection signal, and outputs the selected impedance value to the first pad termination circuit.

28. The control circuit of claim 19 wherein the first circuit further comprises a fifth input for inputting a deactivation impedance value, and wherein the selector selects one of the fixed impedance value, the variable impedance value, and the deactivation impedance value, in response to the selection signal, and outputs the selected impedance value to the first pad termination circuit.

29. A method for controlling the impedance of a pad termination comprising:
inputting a variable impedance value at a first input;
inputting a fixed impedance value at a second input; and
selecting one of the fixed impedance value and the variable impedance value in response to a selection signal, and outputting a selected impedance value to a pad termination circuit that provides the impedance of the pad termination in response to the selected impedance value.

30. The method of claim 29 wherein the fixed impedance value is generated in response to an open or closed state of a fuse, hard-wired state, or bonding state.

31. The method of claim 29 wherein the fixed impedance value comprises a first fixed impedance value and further comprising:
inputting a second fixed impedance value at a third input;
selecting one of the first fixed impedance value, the second fixed impedance value and the variable impedance value in response to the selection signal; and
outputting the selected impedance value to the pad termination circuit.

32. The method of claim 29 further comprising:
inputting a deactivation impedance value at a fourth input;
selecting one of the fixed impedance value, the variable impedance value, and the deactivation impedance value in response to the selection signal; and
outputting the selected impedance value to the pad termination circuit.

33. The method of claim 32 wherein the pad termination circuit applies the deactivation impedance value by removing the applied impedance.

34. The method of claim 29 wherein further comprising generating the variable impedance value at a self-calibration circuit.

35. The method of claim 29 wherein the fixed and variable impedance values comprise a plurality of binary bits.

36. The method of claim 35 wherein the pad termination circuit comprises a bank of resistors, individually selectable according to the binary bits of the fixed or variable impedance values.

37. The method of claim 36 wherein the plurality of resistors have resistance values that are binary multiples of each other and are connected to a common node that is coupled to a bonding pad, and wherein the impedance of the pad termination is determined by the combined selected resistance values.

38. The method of claim 29 wherein the selected impedance value comprises a first selected impedance value and further comprising outputting a second selected impedance value in response to the first selected impedance value to a second pad termination circuit that provides a second impedance of a second pad termination in response to the second selected impedance value.

39. The method of claim 38 wherein the second selected impedance value is one of the same as the first selected impedance value, a multiple of the first selected impedance value, a deactivation value, or is independent of the first selected impedance value.

40. The method of claim 38 wherein one of the first selected impedance value and second selected impedance value is used for termination of one of data and address pads and the other of the first selected impedance value and second selected impedance value is used for termination of the other of data and address pads.

41. The method of claim 40 wherein at least one of the first and second selected impedance values is further used for termination of command signal pads.

42. The method of claim 41 wherein the command signal pads comprise pads for at least one of a chip select signal (CSB), a row address signal (RASB), a column address strobe signal (CASB) and a write enable signal (WEB).

43. The method of claim 29 wherein the selection signal is generated in response to a mode register set (MRS) command used for setting the operation mode of a memory device.

44. The method of claim 29 wherein the impedance value comprises pull-up and pull-down impedance values.

45. A method for controlling the impedance of a pad termination at first and second circuit pads comprising:
generating a first selected impedance value comprising:
inputting a variable impedance value at a first input;
inputting a fixed impedance value at a second input; and
selecting one of the fixed impedance value and the variable impedance value in response to a selection signal, and outputting a first selected impedance value to a first pad termination circuit that provides the impedance of the first circuit pad termination in response to the first selected impedance value; and
generating a second selected impedance value comprising:
inputting the first selected impedance value at a third input; and outputting, in response to the first selected impedance value, a second selected impedance value to a second pad termination circuit that provides the impedance of the second pad termination in response to the second selected impedance value.

46. The method of claim 45 wherein the second selected impedance value is one of the same as the first selected impedance value, a multiple of the first selected impedance value, a deactivation value, or is independent of the first selected impedance value.

47. The method of claim 45 wherein one of the first selected impedance value and second selected impedance value is used for termination of one of data and address pads and the other of the first selected impedance value and second selected impedance value is used for termination of the other of data and address pads.

48. The method of claim 47 wherein at least one of the first and second selected impedance values is further used for termination of command signal pads.

49. The method of claim 48 wherein the command signal pads comprise pads for at least one of a chip select signal (CSB), a row address signal (RASB), a column address strobe signal (CASB) and a write enable signal (WEB).

50. The method of claim 45 wherein the selection signal is generated in response to a mode register set (MRS) command used for setting the operation mode of a memory device.

51. The method of claim 45 wherein further comprising outputting the second selected impedance value in response to a second selection signal.

52. The method of claim 51 wherein the second selection signal is generated in response to a mode register set (MRS) command used for setting the operation mode of a memory device.

53. The method of claim 45 wherein the fixed impedance value comprises a first fixed impedance value and wherein generating a first selected impedance value comprises:
   inputting a second fixed impedance value at a fourth input;
   selecting one of the first fixed impedance value, the second fixed impedance value and the variable impedance value in response to the selection signal; and
   outputting the selected impedance value to the first pad termination circuit.

54. The method of claim 45 wherein generating a first selected impedance value further comprises:
   inputting a deactivation impedance value at a fifth input,
   selecting one of the fixed impedance value, the variable impedance value, and the deactivation impedance value in response to the selection signal; and
   outputting the selected impedance value to the first pad termination circuit.

* * * * *